United States Patent

Jeong et al.

Patent Number: 5,881,007
Date of Patent: Mar. 9, 1999

[54] SENSE AMPLIFIER ENABLE SIGNAL GENERATOR FOR SEMICONDUCTOR MEMORY DEVICE

[75] Inventors: Yong Gwon Jeong; Jin Seung Son, both of Ichon, Rep. of Korea

[73] Assignee: Hyundai Electronics Industries Co., Ltd., Ichon, Rep. of Korea

[21] Appl. No.: 965,861

[22] Filed: Nov. 7, 1997

[30] Foreign Application Priority Data

Dec. 31, 1996 [KR] Rep. of Korea .................. 1996-80246

[51] Int. Cl.⁶ ..................................... G11C 7/02
[52] U.S. Cl. .................. 365/207; 365/205; 365/189.07; 365/233
[58] Field of Search ................................. 365/207, 205, 365/189.07, 233; 327/51

[56] References Cited

U.S. PATENT DOCUMENTS

| | | |
|---|---|---|
| 4,879,685 | 11/1989 | Takemae . |
| 4,906,870 | 3/1990 | Gongwer . |
| 5,343,438 | 8/1994 | Choi et al. ............................. 365/233 |
| 5,708,624 | 1/1998 | Leung ..................................... 365/233 |

*Primary Examiner*—Huan Hoang
*Attorney, Agent, or Firm*—Thelen Reid & Priest LLP

[57] ABSTRACT

A sense amplifier enable signal generator for a semiconductor memory device, comprising a counter for generating a pulse signal synchronously with a clock signal when a row address strobe bar signal is made active and suppressing the generation of the pulse signal when the row address strobe bar signal is disabled, and a comparator for generating a sense amplifier enable signal when an output value from the counter reaches a predetermined time delay value and suppressing the generation of the sense amplifier enable signal when the row address strobe bar signal is disabled. According to the present invention, a sense amplifier can be operated at a proper time without being affected by a process parameter, an operating voltage, temperature, etc.

4 Claims, 2 Drawing Sheets

FIG. 1(a) CLK
PRIOR ART
FIG. 1(b) RASB
PRIOR ART
FIG. 1(c) WL
PRIOR ART
FIG. 1(d) BL/BL
PRIOR ART
FIG. 1(e) SE
PRIOR ART
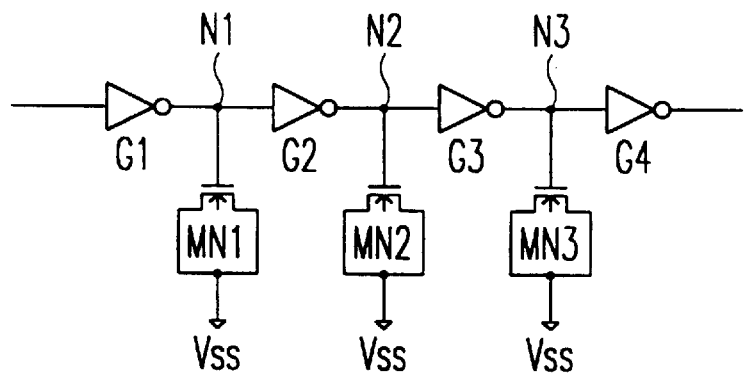
FIG. 2
PRIOR ART

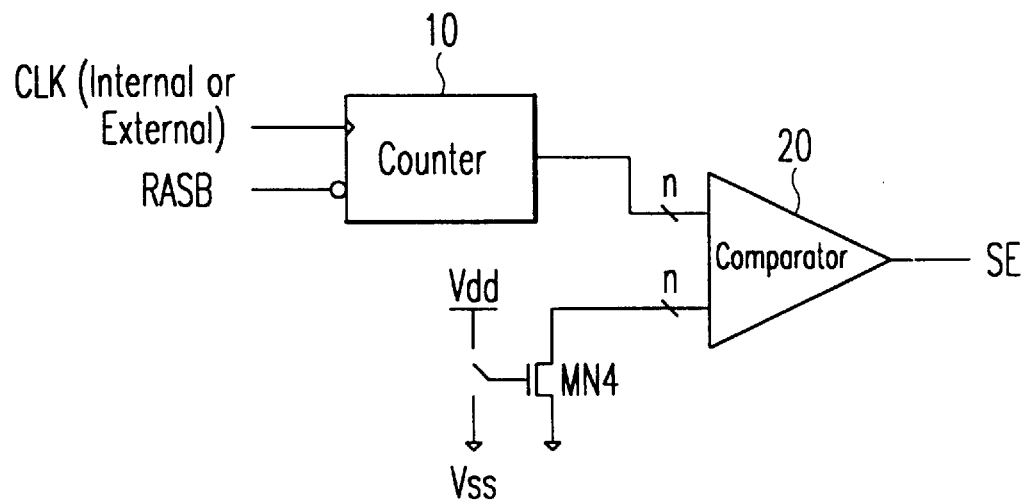
FIG. 3
FIG. 4(a) CLK
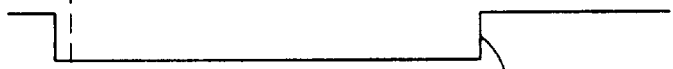
FIG. 4(b) RASB
FIG. 4(c) COUNTER
FIG. 4(d) SE

SENSE AMPLIFIER ENABLE SIGNAL GENERATOR FOR SEMICONDUCTOR MEMORY DEVICE

BACKGROUND OF THE INVENTION

1. Field of the Invention

The present invention relates in general to a sense amplifier enable signal generator for a semiconductor memory device, and more particularly to a sense amplifier enable signal generator for a dynamic random access memory (referred to hereinafter as DRAM) in which a counter and a comparator are provided to generate a sense amplifier enable signal as a control signal for a sense amplifier in the DRAM to operate the sense amplifier at a proper time without being affected by a process parameter, an operating voltage, temperature, etc.

2. Description of the Prior Art

First, the operation of a general DRAM will be described briefly with reference to FIGS. 1a to 1e.

FIGS. 1a to 1e are timing diagrams of signals related to the operation of a sense amplifier in the DRAM. First, when a row address strobe bar signal RASB, which is a main signal operating the DRAM, is made active low, a row address buffer receives a row address. A row decoding operation is performed to decode the row address received by the row address buffer to select a corresponding one of word lines of a cell array block. Then, data from cells connected to the selected word line WL are transferred to bit lines BL and /BL. At this time, a signal which indicates an operating time point of the sense amplifier is enabled to operate a sense amplifier drive circuit of the cell array block selected by the row address. As the sense amplifier drive circuit is operated, sense amplifier bias voltages have supply and ground voltage levels Vcc and Vss, respectively, thereby driving the sense amplifier. If the sense amplifier begins to be operated, a voltage difference between the bit lines BL and /BL is changed from a very small value to a large value. Under this condition, a column decoder selected by a column address turns on a column transfer transistor to transfer the data on the bit lines BL and /BL to data bus lines DB and /DB, respectively.

Noticeably, at the time that a small voltage difference of about 0.2–0.3 V is generated between the bit lines BL and /BL due to the data from the cells connected to the selected word line WL, a sense amplifier enable signal SE is made active to operate the sense amplifier (see FIG. 1e). However, in the case where the voltage difference between the bit lines BL and /BL does not have a sufficient value, a faulty operation occurs when the sense amplifier enable signal SE is made active to operate the sense amplifier.

FIG. 2 is a circuit diagram illustrating the construction of a conventional delay circuit which implements a time delay required between the row address strobe bar signal RASB and sense amplifier enable signal SE shown respectively in FIGS. 1b and 1e. As shown in this drawing, a time delay from an enable point of the row address strobe bar signal RASB till an active point of the sense amplifier enable signal SE is established by the coupling of inverters and capacitors. This conventional delay circuit is disadvantageous in that a delay value may be varied due to a process variation, a dynamic temperature variation and a supply voltage noise, resulting in a device failure. In the case where a large amount of design margin is introduced to overcome the above problem, a device access time is damaged.

SUMMARY OF THE INVENTION

Therefore, the present invention has been made in view of the above problems, and it is an object of the present invention to provide a sense amplifier enable signal generator for a semiconductor memory device which is capable of operating a sense amplifier at a proper time without being affected by a process parameter, an operating voltage, temperature, etc.

In accordance with the present invention, the above and other objects can be accomplished by a provision of a sense amplifier enable signal generator for a semiconductor memory device, comprising counting means for generating a pulse signal synchronously with a clock signal when a row address strobe bar signal is made active and suppressing the generation of the pulse signal when the row address strobe bar signal is disabled; and comparison means for generating a sense amplifier enable signal when an output value from the counting means reaches a predetermined time delay value and suppressing the generation of the sense amplifier enable signal when the row address strobe bar signal is disabled.

BRIEF DESCRIPTION OF THE DRAWINGS

The above and other objects, features and advantages of the present invention will be more clearly understood from the following detailed description taken in conjunction with the accompanying drawings, in which:

FIGS. 1a to 1e are timing diagrams of signals related to the operation of a general sense amplifier;

FIG. 2 is a circuit diagram illustrating the construction of a conventional delay circuit which implements a time delay required between a row address strobe bar signal and a sense amplifier enable signal shown respectively in FIGS. 1b and 1e;

FIG. 3 is a circuit diagram illustrating the construction of a sense amplifier enable signal generator for a semiconductor memory device in accordance with an embodiment of the present invention; and FIGS. 4a to 4d are timing diagrams illustrating the operation of the sense amplifier enable signal generator in FIG. 3.

DETAILED DESCRIPTION OF THE PREFERRED EMBODIMENTS

FIG. 3 is a circuit diagram illustrating the construction of a sense amplifier enable signal generator for a semiconductor memory device in accordance with an embodiment of the present invention. As shown in this drawing, the sense amplifier enable signal generator comprises a counter 10 for generating a pulse signal synchronously with a clock signal CLK when a row address strobe bar signal RASB is made active and suppressing the generation of the pulse signal when the row address strobe bar signal RASB is disabled, and a comparator 20 for comparing an output signal from the counter 10 with a predetermined time delay value and generating a sense amplifier enable signal SE in accordance with the compared result. When an output value from the counter 10 reaches the predetermined time delay value, the comparator 20 generates the sense amplifier enable signal SE. Then, when the row address strobe bar signal RASB is disabled, the comparator 20 suppresses the generation of the sense amplifier enable signal SE. To this end, the comparator 20 receives the output value from the counter 10 at its one input terminal and the predetermined time delay value at its other input terminal. The predetermined time delay value is a counter bit value corresponding to the optimum delay amount obtained in testing, which can readily be programmed by properly connecting a gate input of an NMOS transistor to either a supply voltage source Vdd or a ground voltage source Vss.

The operation of the sense amplifier enable signal generator with the above-mentioned construction in accordance with the embodiment of the present invention will hereinafter be described in detail with reference to FIGS. 4a to 4d.

FIGS. 4a to 4d are timing diagrams illustrating the operation of the sense amplifier enable signal generator in FIG. 3. FIGS. 4a and 4b show the clock signal CLK and row address strobe bar signal RASB, respectively, and FIGS. 4c and 4d show the counter output signal and sense amplifier enable signal SE, respectively.

At the time that the row address strobe bar signal RASB is made active low, the counter 10 begins to output a count pulse signal synchronously with the clock signal CLK. The comparator 20 compares the count value from the counter 10 with the predetermined count value (the other input bit value of the comparator 20). When the count value from the counter 10 reaches the predetermined count value, the comparator 20 outputs the sense amplifier enable signal SE to operate a sense amplifier. Then, when the row address strobe bar signal RASB is disabled from low to high in logic, the comparator 20 suppresses the generation of the sense amplifier enable signal SE. Namely, when the output value from the counter 10 reaches the predetermined count value, the sense amplifier enable signal SE goes from low to high in logic. Then, when the row address strobe bar signal RASB is disabled from low to high in logic, the counter 10 is disabled, thereby causing the sense amplifier enable signal SE to go from high to low in logic. As a result, the sense amplifier enable signal generator returns to the initial state and the sense amplifier is not operated.

In the preferred embodiment of the present invention, an obtainable delay range is $(2^N-1)*(1/f_{CLK})$, where N is the counter bits number and $f_{CLK}$ is a frequency of the clock signal CLK. Here, the obtainable minimum delay unit is $1/f_{CLK}$. As a result, the clock signal CLK must have a higher frequency for the improvement in a delay resolution. To this end, it is required to reutilize the existing clock signal for a DRAM operation (for example, an oscillator output signal used as an input of a refresh counter in a self-refresh operation) or to generate a new high-frequency clock signal in the chip.

As apparent from the above description, the present invention provides the sense amplifier enable signal generator for the DRAM which has the following advantages.

First, the optimum delay amount of the DRAM can readily be programmed in testing and the minimum DRAM access time can thus be secured.

Second, the obtainable delay range is freely adjustable within a limit of the counter bits number, resulting in an increase in design margin and an improvement in throughput.

Third, the use of the internal high-frequency clock signal allows the delay resolution to become finer than that in the conventional technique employing an RC delay of inverters and capacitors.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A sense amplifier enable signal generator for a semiconductor memory device, comprising:

counting means for generating a pulse signal synchronously with a clock signal when a row address strobe bar signal is made active and suppressing the generation of said pulse signal when said row address strobe bar signal is disabled; and comparison means for generating a sense amplifier enable signal when an output value from said counting means reaches a predetermined time delay value and suppressing the generation of said sense amplifier enable signal when said row address strobe bar signal is disabled.

2. A sense amplifier enable signal generator for a semiconductor memory device, as set forth in claim 1, wherein said time delay value is programmed by an NMOS transistor, said NMOS transistor being connected between an input terminal of said comparison means and a ground voltage terminal and having its gate connected to a supply voltage terminal.

3. A sense amplifier enable signal generator for a semiconductor memory device, as set forth in claim 1, wherein said time delay value is programmed by an NMOS transistor, said NMOS transistor being connected between an input terminal of said comparison means and a ground voltage terminal and having its gate connected to said ground voltage terminal.

4. A sense amplifier enable signal generator for a semiconductor memory device, as set forth in claim 1, wherein said clock signal is generated from a ring oscillator.

* * * * *